United States Patent
Tu et al.

(10) Patent No.: US 6,566,250 B1
(45) Date of Patent: May 20, 2003

(54) METHOD FOR FORMING A SELF ALIGNED CAPPING LAYER

(75) Inventors: Yeur-Luen Tu, Taichung (TW);
Chih-Yang Pai, Hsin-chu (TW);
Chia-Shiung Tsai, Hsin-chu (TW)

(73) Assignee: Taiwant Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/100,429

(22) Filed: Mar. 18, 2002

(51) Int. Cl.[7] .......................................... H01L 21/4763
(52) U.S. Cl. ...................................... 438/637; 438/643
(58) Field of Search ................................ 438/626, 627, 438/637, 639, 643, 653, 675, 685, 641, 649, 651

(56) References Cited

U.S. PATENT DOCUMENTS 6,221,757 B1 * 4/2001 Schmidbauer et al.
6,380,084 B1 * 4/2002 Lim et al.

* cited by examiner

Primary Examiner—David Nelms
Assistant Examiner—Phuc T. Dang
(74) Attorney, Agent, or Firm—Tung & Associates

(57) ABSTRACT

A method for forming a self-aligned capping layer over a metal filled feature in a multi-layer semiconductor device including providing an anisotropically etched feature included in a substrate; blanket depositing a first barrier layer over the anisotropically etched feature to prevent diffusion of a metal species into the substrate; filling the anisotropically etched feature with a metal to form a metal filled feature substantially filled with metal; planarizing the substrate surface to include forming an exposed surface of the metal filled feature; and, selectively depositing a second barrier layer to cover the exposed surface of the metal filled feature to form a capping layer.

20 Claims, 2 Drawing Sheets

METHOD FOR FORMING A SELF ALIGNED CAPPING LAYER

FIELD OF THE INVENTION

This invention generally relates to protective layer in semiconductor devices and more particularly to formation of a self aligned capping layer over a metal filled semiconductor feature.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

Sub-micron multi-level metallization is one of the key technologies for the next generation of ultra large scale integration (ULSI. The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) or physical vapor deposition (PVD) have difficulty achieving conformal coatings and adequate step coverages in filling increasingly high aspect ratio features, for example, where the aspect ratio exceeds 2:1, and particularly where it exceeds 4:1.

As a result of these process limitations, electroplating (electrodeposition) or electroless plating, which methods have previously been limited to the fabrication of patterns on circuit boards, are now emerging as preferable methods for filling metal interconnects structures such as via openings and trench line openings on semiconductor devices. Typically, electroplating uses a suspension of positively charged ions of deposition material, for example metal ions, in contact with a negatively charged substrate, as a source of electrons, to deposit (plate out) the metal ions onto the charged substrate, for example, a semiconductor wafer. A thin metal layer (seed layer) is first deposited on the semiconductor wafer and within etched features to provide an electrical path across the surfaces. An electrical current is supplied to the seed layer whereby the semiconductor wafer surface is electroplated with an appropriate metal, for example, aluminum or copper.

One exemplary process for forming a series of interconnected multiple layers, for example, is a damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multi layer device. Metal interconnect lines typically serve to selectively interconnect conductive regions within a layer of a multilayer device. Vias and metal interconnect lines are selectively interconnected in order to form the necessary electrical connections.

In forming a damascene structure, via openings and trench line openings are etched into one or more insulating layers and are back-filled with metal, for example copper. The insulating layers (IMD layers) are typically a low-k (low dielectric constant) insulating material which reduces signal delay times caused by parasitic capacitance. The process by which via openings (holes) and trench lines are selectively etched into the insulating layers is typically a photolithographic masking process, followed by a reactive ion etch (RIE) process, both of which are commonly known in the art.

In filling the via openings and trench line openings with metal, for example, copper, electroplating is a preferable method to achieve superior step coverage of sub-micron etched features. The method generally includes first depositing a barrier layer, for example Tantalum nitride or titanium nitride over the etched opening surfaces, such as via openings and trench line openings, removing excess barrier layer from the wafer surface according to CMP, depositing a metal seed layer, for example by electro deposition , preferably copper, over the barrier layer, and then electroplating a metal, for example copper, over the seed layer to fill the etched features to form, for example, vias and trench lines. Finally, the deposited layers and the dielectric layers are planarized, for example, by chemical mechanical polishing (CMP), to define a conductive interconnect feature.

Metal electroplating in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface is contacted with an electrical power source forming the cathode of the plating system such that ions in the plating solution deposit on the conductive portion of the plating surface. Alternatively, spontaneous electrodeposition without an applied potential can occur if thermodynamically favorable conditions exist with respect to the substrate and electroplating solution which are conducive to spontaneous electrodeposition (electroless plating).

One problem with the prior art damascene formation process including electrodeposition methods include the incomplete coverage of the barrier layers, for example, tantalum nitride and titanium nitride. Barrier layers are used to cover the walls and bottoms of semiconductor features, such as damascene structures, to prevent the diffusion of copper into surrounding insulating layer, for example low dielectric porous oxides. As device sizes shrink and aspect ratios increase, coverage of conformal layers including barrier layers by PVD and CVD is increasingly problematical, often leaving uncovered areas, for example, near the upper surfaces of trench lines. In addition, a capping layer such as silicon carbide and metal nitrides such as, silicon nitride, or silicon oxynitride are typically formed over the metal filled damascene structure in order to prevent copper diffusion into overlying insulating layers. A shortcoming of these capping layers is that they typically have relatively high dielectric constants (e.g., >6.5) thereby increasing the overall average dielectric constant, and signal delay time constants of the multilayer semiconductor device. Another shortcoming includes poor adhesion between the capping layer and porous low-k dielectric insulating layer, frequently resulting in peeling of layers when subjected to, for example, CMP induced stresses.

There is therefore a need in the semiconductor processing art to develop a method whereby a protective capping layer may be applied to protect surrounding materials from copper diffusion while minimizing contributions to the overall dielectric constant.

It is therefore an object of the invention to provide a method whereby a protective capping layer may be applied to protect surrounding materials from copper diffusion while minimizing contributions to the overall dielectric constant.

SUMMARY OF THE INVENTION

To achieve the foregoing and other objects, and in accordance with the purposes of the present invention, as embodied and broadly described herein, the present invention provides a method for forming a self-aligned capping layer over a metal filled feature in a multi-layer semiconductor device.

In a first embodiment according to the present invention, the method includes providing an anisotropically etched feature included in a substrate; blanket depositing a first barrier layer over the anisotropically etched feature to prevent diffusion of a metal species into the substrate; filling the anisotropically etched feature with a metal to form a metal filled feature substantially filled with metal; and, planarizing the substrate surface to include forming an exposed surface of the metal filled feature; and, selectively depositing a second barrier layer to cover the exposed surface of the metal filled feature to form a capping layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of a dual damascene structure, the method may advantageously be applied in the formation of any semiconductor feature where it would be advantageous to dispense with the formation of a protective capping layer and thereby reduce adhesion problems and increased dielectric constant drawbacks. For example, copper bonding or contact pads could benefit from the method of the present invention. By use of the term "copper" herein is included copper or alloys thereof.

Figure 1A:
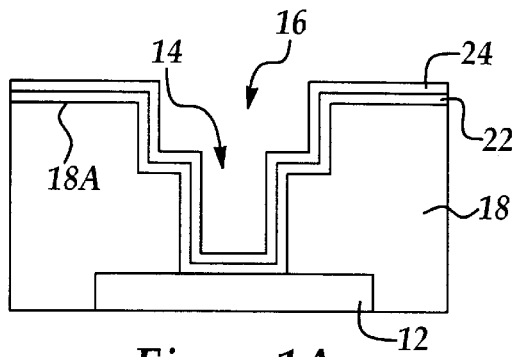
FIGS. 1A–1F are representative cross sectional side view representations of portions of multilayer semiconductor device at stages in a manufacturing process according to the present invention.

Referring to FIG. 1A, the method of the present invention will now be explained with respect to a dual damascene structure. Shown in FIG. 1A is a dual damascene structure that includes a via opening 14 and a trench line opening 16 formed over the via opening, both openings formed in an insulating inter-layer dielectric (ILD) layer 18, for example, a low-k (low dielectric constant) insulating layer. There are several low-k materials that are used for the ILD layer including for example, carbon doped oxide and fluorinated silica glass (FSG). It will be appreciated that the method of the present invention may be advantageously used with any insulating ILD layer including low-k ILD layer where protection of the layer from in-diffusion of metal, for example, copper would be advantageous.

There are several approaches to creating the dual damascene structure, but all approaches generally include at least two photolithographic patterning and plasma etching steps to form via opening 14 and trench line opening 16. Via opening 14 is typically in contact with an underlying conductive area 12, which may be, for example, a copper filled trench line.

Although a capping layer may be formed over ILD layer 18 prior to forming via openings and trench line openings, for example, silicon carbide or a metal nitride such as silicon nitride (e.g., SiN) or silicon oxynitride (e.g., SiON), FIG. 1A, according to the present invention is shown without such a capping layer, as the necessity for such layer is obviated by the method of the present invention.

In the method according to the present invention, a barrier layer 22, for example a metal nitride such as tantalum nitride and titanium nitride or combinations thereof is blanket (conformally) deposited to cover the via opening 14 and trench line opening 16 to include the upper surface 18A of ILD layer 18 as shown in FIG. 1A. The barrier layer may be deposited by conventional processes including PVD, CVD, or PECVD, such processes being well known in the art. The barrier layer typically has a thickness between about 25 Angstroms and about 500 Angstroms.

Following formation of the metal nitride barrier layer 22, the dual damascene structure, for example, including the via opening 14 and trench line opening 16 are filled with a conductive metal, for example copper. Although there are various methods for filling the damascene structure with metal including for example, PVD, CVD, electroless and electrodeposition, an electrodeposition method, while not necessary for the practice of the present invention, is preferable. For example, electrodeposition onto a copper seed layer is preferable to achieve better step coverage of the copper.

In order to carry out an electrodeposition process to fill the damascene structure with metal, a metal seed layer 24, for example copper, according to one embodiment of the present invention, is blanket deposited, for example by CVD or PVD over the barrier layer 22 as shown in FIG. 1A. The seed layer 24 provides good adhesion and an electrically conductive surface for applying a potential to electrodeposit overlying metal layers to fill the via opening and trench line opening. The seed layer 24 is deposited over the active areas included in a semiconductor wafer, for example via openings and trench line openings. The seed layer provides an electrically conductive layer for a cathodic reaction in an electroplating process where metal ions, for example copper, in an electroplating solution (electrolyte) are deposited out of solution onto the seed layer 24, also copper. The thickness of the seed layer 24 may vary between about 200 angstroms and 2000 angstroms depending upon process constraints.

Figure 1B:
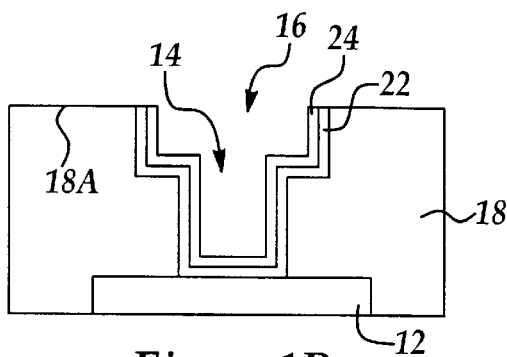

In another embodiment, shown in FIG. 1B, the barrier layer 22 is first removed from the surface 18A by a CMP polishing process followed by a deposition of a copper seed layer 24 according to a galvanic deposition method where copper is selectively electrodeposited onto the barrier layer 22, for example tantalum, or tantalum nitride. The galvanic electrodeposition of copper is a spontaneous catalytic process under specific conditions according to Faraday's law. This embodiment eliminates the necessity for a CMP process to be carried out after filling the dual damascene structure with metal and thereby obviates potential peeling.

Figure 1C:
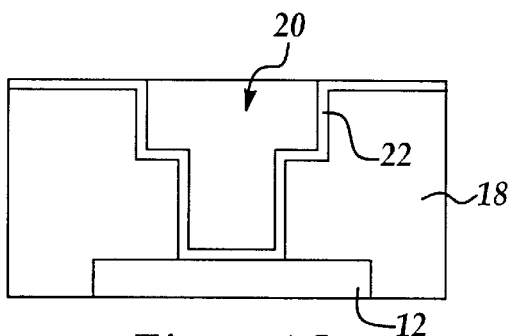
Figure 1D:
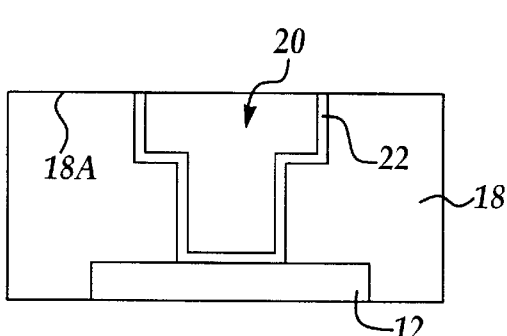

Following formation of the seed layer, 24, for example copper, preferably an electrodeposition reaction is carried out to complete the filling of the damascene structure 20 including via opening 14 and trench line opening 16 to form, for example, copper filled vias and trench lines. Following metal filling of the damascene structure, a CMP process may be carried out to remove one or both of the overlying layers of the barrier layer 22 and the copper seed layer 24 from the surface 18A of ILD layer 18. For example, the result of selective removal by CMP of the copper seed layer 24 while leaving the barrier layer 22 is shown in FIG. 1C following metal filling to form metal-filled damascene structure 20. The metal-filled damascene structure 20 with both the copper seed layer 24 and barrier layer 22 removed by CMP from the upper surface of ILD layer 18A following metal filling of the damascene structure is shown in FIG. 1D. Both the embodiment shown in FIG. 1C and 1D reduce a contribution to dielectric constant. The embodiment shown in FIG. 1D may be preferable in that it will have improved adhesion to a subsequently formed overlying ILD layer (not shown).

Figure 1E:
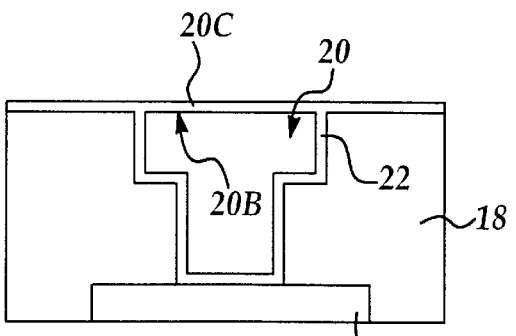
Figure 1F:
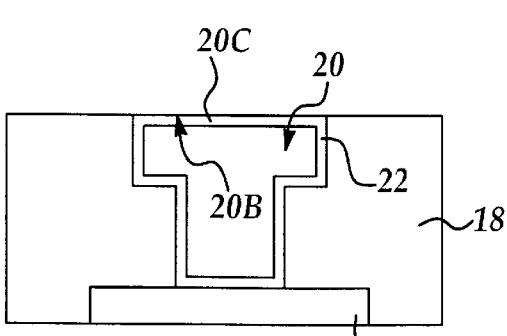

According to one embodiment of the present invention, as shown in FIG. 1E and 1F, corresponding respectively to previous manufacturing stages in respective embodiments shown in FIGS. 1C and 1D, the copper dual damascene structure is encapsulated by selectively forming a metal nitride capping layer 20C by first selectively galvanically depositing a metal followed by a nitridation process to form the metal nitride. Following a CMP process as shown in FIGS. 1C or 1D, a metal, for example, tantalum or titanium, is selectively deposited over the exposed copper surface 20B to form a metal nitride capping layer as respectively shown in FIGS. 1E and 1D. According to the present invention, the metal nitride capping layer 20C is self aligned in that the metal component of the metal nitride, for example tantalum or titanium, is selectively deposited to cover the copper surface 20B according to an electrochemical reaction. Preferably, a selective galvanic deposition is carried out to first electrodeposit the metal component of the metal nitride capping layer, for example, tantalum or titanium, to cover the exposed copper surface 20B of the trench line as shown in FIGS. 1E or 1F. Since the galvanic reaction acts to displace copper ions with the galvanically deposited metal, the surface 20B remains planarized as the metal component of the metal nitride layer is galvanically deposited to form layer 20C as shown in FIGS. 1E or 1F corresponding to the preceding respective embodiments with or without a surface barrier layer shown in FIGS. 1C and 1D, respectively.

Preferably, the tantalum or titanium layer is galvanically deposited to a thickness of between about 200 and 500 Angstroms. Next, a conventional nitridation step is carried out by exposing the metal to a nitrogen containing plasma to form a metal nitride capping layer 20C to encapsulate the dual damascene structure with a metal nitride barrier such as at tantalum nitride or titanium nitride. Preferably the capping layer 20C is the same material as barrier layer 22 to form a continuous surface layer according to the embodiment shown in FIG. 1E. It will be appreciated however, that the capping layer 20C may also be a different metal nitride.

In one embodiment of the present invention, according to well known electrochemical laws, including Faraday's law, a spontaneous formation (galvanic deposition) of, for example, tantalum, will take if the concentration of $Cu^{+2}$ ions is less than about $1\times10^{-40}$ Molar (Moles/Liter). For example the overall electrochemical reaction for the deposition of tantalum onto copper is as follows:

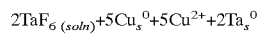

$$2TaF_{6\ (soln)} + 5Cu_s^0 + 5Cu^{2+} + 2Ta_s^0$$

Where the subscript 's' refers to the solid phase and $Cu^{2+}$ is understood to be ions of copper in the solution (soln) phase (electrolyte). Preferably, the selective galvanic deposition is carried out in a non-aqueous solution, such as methanol to reduce the formation of hydroxide or oxides of copper, for example $Cu(OH)_2$, which inhibits the overall galvanic reaction. An exemplary galvanic deposition solution includes for example by weight percent, from about 0.1 percent to about 5 percent of a sulfate of the metal, for example tantalum or titanium sulfate; from about 8 percent to about 15 percent hydrogen fluoride; and from about 80 to about 91.5 percent anhydrous methanol.

Figure 2:
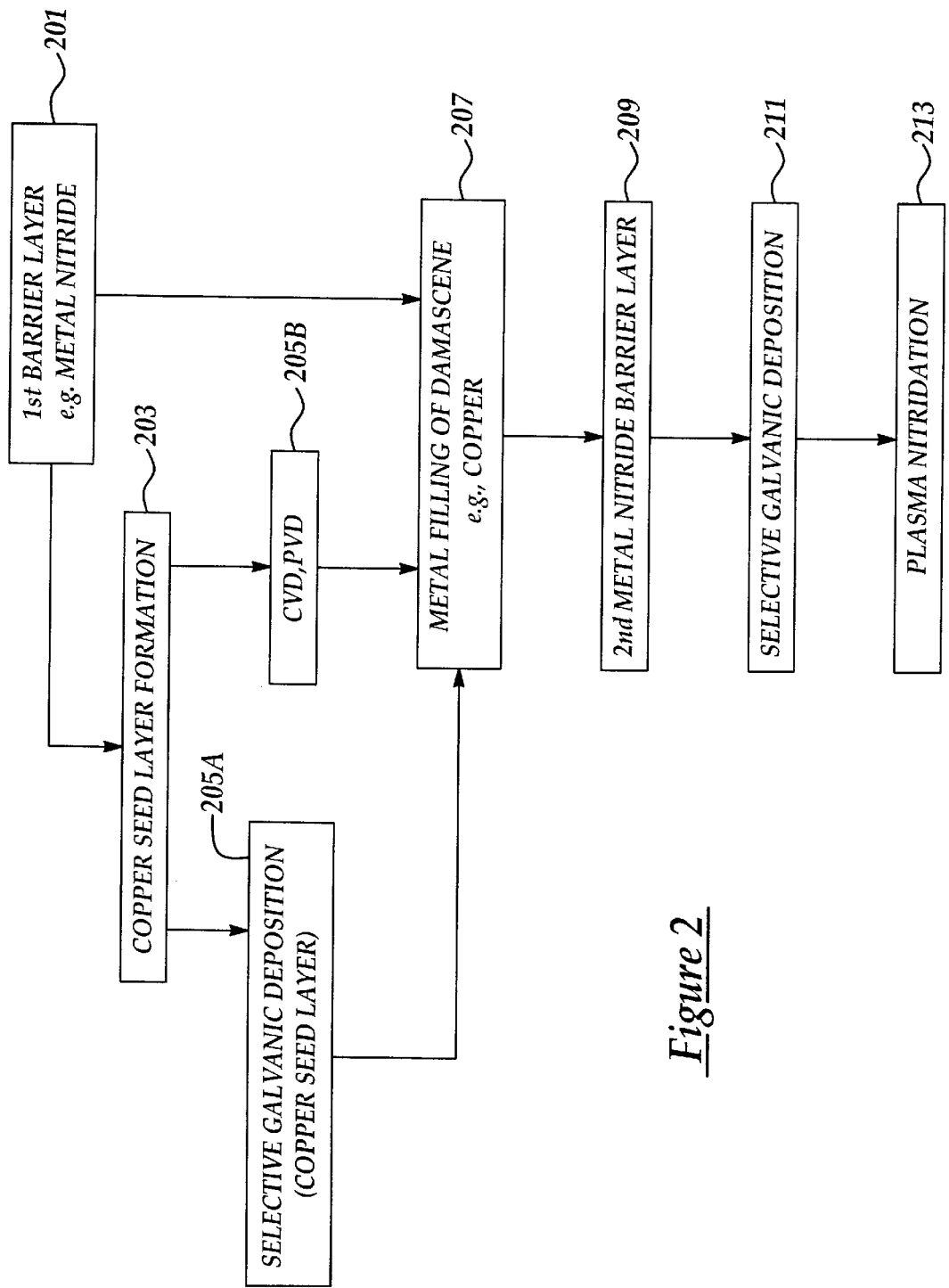
FIG. 2 is a representative process flow diagram including several embodiments of the method according to the present invention.

Turning to FIG. 2, is a process diagram including several of the embodiments of the present invention. For example, a barrier layer is blanket deposited to fill a semiconductor feature, for example a damascene feature according to process 201. Following process 201, the damascene feature is filled with a metal, for example copper according to process 207. In preferred embodiments, the damascene feature is preferably metal filled with metal according to an electrodeposition process where for example a copper seed layer is first blanket deposited according to a preferred embodiment step 203. In an alternative embodiment, the copper seed layer is formed by a PVD or CVD process. The substrate may then be planarized by a CMP process (not shown) prior to the metal filling step 207, preferably an electrodeposition process. In another embodiment, the substrate is planarized following process 203 to remove the barrier layer from the surface by a CMP process (not shown) prior to forming a seed layer by selective galvanic deposition in process 205a with selective deposition onto the barrier layer remaining within the damascene feature in process 205A which is then followed by a metal filling process in step 207, for example an electrodeposition process.

Following metal filling of the damascene feature according to process 207, a CMP process (not shown) is performed to selectively remove the excess copper metal from the surface or both the copper and surface barrier layer. According to process 209, a second metal nitride layer (self-aligned capping layer) is selectively deposited over the exposed copper surface of the damascene feature to form a self-aligned capping layer. In a preferred embodiment of process 209 shown in process steps 211 and 213, the metal component of a metal nitride barrier layer is first selectively deposited according to a selective galvanic deposition over the exposed copper surface in the damascene structure in process 211 followed by a nitridation process 213 to complete the encapsulation of the metal filling and the formation of a self aligned capping layer.

Thus, according to the present invention, a method of forming a dual damascene structure has been provided whereby a multi-layer semiconductor structure having an anisotropically etched semiconductor feature formed in an ILD layer filled with a metal, for example copper, is encapsulated with a metal nitride barrier layer including a self-aligned metal nitride capping layer to prevent diffusion of the metal into adjacent ILD layers whereby a contribution to the dielectric constant is reduced. In one preferred embodiment, the self-aligned capping layer is formed by a selective galvanic deposition of metal onto a copper surface where the concentration of copper ions is kept at less than about $10^{-6}$ Molar, followed by plasma nitridation to form a metal nitride layer overlying a copper filled semiconductor feature.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a self-aligned capping layer over a metal filled feature in a multi-layer semiconductor device comprising the steps of:

providing an anisotropically etched feature included in a substrate;

blanket depositing a first barrier layer over the anisotropically etched feature to prevent diffusion of a metal species into the substrate;

filling the anisotropically etched feature with a metal to form a metal filled feature substantially filled with metal;

planarizing the substrate surface to include forming an exposed surface of the metal filled feature; and, selectively depositing a second barrier layer to cover the exposed surface of the metal filled feature to form a capping layer includes sequential steps of selective galvanic deposition of a second barrier layer metal and plasma nitridation of the second barrier layer metal.

2. The method of claim 1, wherein the first and second barrier layers include a metal nitride.

3. The method of claim 2, wherein the metal nitride is at least one of tantalum nitride and titanium nitride.

4. The method of claim 1, wherein the substrate includes a low dielectric constant material.

5. The method of claim 1, wherein the anisotropically etched feature includes at least one of vias and trench lines.

6. The method of claim 1, wherein the metal includes at least one of copper, aluminum, and tungsten.

7. The method of claim 1, wherein the step of filling includes forming a seed layer to at least cover the floor and sidewalls of the anisotropically etched feature.

8. The method of claim 7, wherein the step of filling includes at least one of electrodeposition and electroless deposition.

9. The method of claim 1, wherein the step of selective galvanic deposition includes maintaining an electrolyte concentration of solvated metal ions comprising the exposed surface sufficiently low to cause galvanic deposition of the second barrier layer metal onto the exposed surface.

10. The method of claim 9, wherein the exposed surface includes copper.

11. The method of claim 10, wherein the second barrier layer metal is at least one of titanium and tantalum.

12. The method of claim 10, wherein the concentration of copper ions is less than about $10^{-6}$ moles per liter.

13. A method for forming a self-aligned capping layer over a copper filled damascene feature comprising the steps of:

providing an unfilled damascene feature included in a substrate;

blanket depositing a first metal nitride barrier layer over the unfilled damascene feature to prevent diffusion of copper into the substrate;

filling the unfilled damascene feature with copper to form a copper filled damascene feature substantially filled with copper;

planarizing the substrate surface to include forming an exposed surface of the copper filled damascene feature; and, selectively depositing a second metal nitride barrier layer to cover the exposed surface of the copper filled damascene feature to form a capping layer includes sequential steps of selective galvanic deposition of a second barrier layer metal and plasma nitridation of the second barrier layer metal.

14. The method of claim 13, wherein the first and second metal nitride barrier layers include at least one of tantalum nitride and titanium nitride.

15. The method of claim 13, wherein the substrate includes a low dielectric constant material.

16. The method of claim 13, wherein the step of filling includes forming a seed layer to at least cover the floor and sidewalls of the anisotropically etched feature.

17. The method of claim 16, wherein the step of filling includes at least one of electrodeposition and electroless deposition.

18. The method of claim 13, wherein the step of selective galvanic deposition includes maintaining an electrolyte concentration of solvated copper ions comprising the exposed surface sufficiently low to cause galvanic deposition of the second metal nitride barrier layer metal onto the exposed surface.

19. The method of claim 13, wherein the second metal nitride barrier layer metal is at least one of titanium and tantalum.

20. The method of claim 18, wherein the concentration of copper ions is less than about $10^{-6}$ Moles per liter.

* * * * *